United States Patent
Marin et al.

(10) Patent No.: US 12,327,814 B2
(45) Date of Patent: Jun. 10, 2025

(54) ELECTRONIC SUBSTRATE CORE HAVING AN EMBEDDED LASER STOP TO CONTROL DEPTH OF AN ULTRA-DEEP CAVITY

(71) Applicant: Intel Corporation, Santa Clara, CA (US)

(72) Inventors: Brandon C. Marin, Gilbert, AZ (US); Sai Vadlamani, Chandler, AZ (US); Omkar Karhade, Chandler, AZ (US); Tolga Acikalin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 17/344,681

(22) Filed: Jun. 10, 2021

(65) Prior Publication Data

US 2022/0399307 A1     Dec. 15, 2022

(51) Int. Cl.
| | |
|---|---|
| *H01L 25/065* | (2023.01) |
| *H01L 23/538* | (2006.01) |
| *H01L 23/64* | (2006.01) |

(52) U.S. Cl.
CPC ...... *H01L 25/0652* (2013.01); *H01L 23/5383* (2013.01); *H01L 23/5384* (2013.01); *H01L 23/5389* (2013.01); *H01L 23/645* (2013.01)

(58) Field of Classification Search
None
See application file for complete search history.

(56) References Cited

U.S. PATENT DOCUMENTS

| | | | |
|---|---|---|---|
| 2019/0051608 A1* | 2/2019 | Sugiyama | H05K 3/4608 |
| 2021/0125905 A1* | 4/2021 | Huang | H01L 23/49827 |
| 2021/0193580 A1* | 6/2021 | Byun | H01L 23/5389 |
| 2022/0148954 A1* | 5/2022 | Huang | H01L 23/5384 |

* cited by examiner

*Primary Examiner* — Anthony Ho
(74) *Attorney, Agent, or Firm* — Essential Patents Group, LLP

(57) ABSTRACT

An electronic substrate may be fabricated having a core comprising a laminate including a metal layer between a first insulator layer and a second insulator layer, a metal via through the core, and metallization features on a first side and a second side of the core, wherein first ones of the metallization features are embedded within dielectric material on the first side of the core, and wherein a sidewall of the dielectric material and of the first insulator layer defines a recess over an area of the metal layer. In an embodiment of the present description, an integrated circuit package may be formed with the electronic substrate, wherein at least two integrated circuit devices may be attached to the electronic substrate. In a further embodiment, the integrated circuit package may be electrically attached to an electronic board. Other embodiments are disclosed and claimed.

20 Claims, 12 Drawing Sheets

ELECTRONIC SUBSTRATE CORE HAVING AN EMBEDDED LASER STOP TO CONTROL DEPTH OF AN ULTRA-DEEP CAVITY

TECHNICAL FIELD

Embodiments of the present description generally relate to the field of integrated circuit package fabrication, and, more specifically, to an integrated circuit assembly including an electronic substrate core having an embedded laser stop to control depth of an ultra-deep cavity in a stack of electronic substrates.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages are refereed to in the art as multi-device multi-chip packages MCPs), or partitioned devices, and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

To address interconnection concerns, a bridge may be embedded in a substrate to which the integrated circuit devices are attached. These bridges support dense integrated circuit device-to-integrated circuit device interconnects, such as from a first integrated circuit device edge to a second integrated circuit device edge, and may support a number of signal lines through the bridge itself, Instead of using an expensive silicon interposer with through silicon vias, the bridge may be an inactive silicon structure or an active silicon device that is embedded in the substrate, enabling the dense integrated circuit device-to-integrated circuit device interconnects only where needed. Standard flip-chip processes may be used to connect the integrated circuit devices to the substrate for robust power delivery and to the bridge within the substrate. Thus, a resulting integrated circuit package may be considerably smaller than an integrated circuit package that is only interconnected with conductive routes within the substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
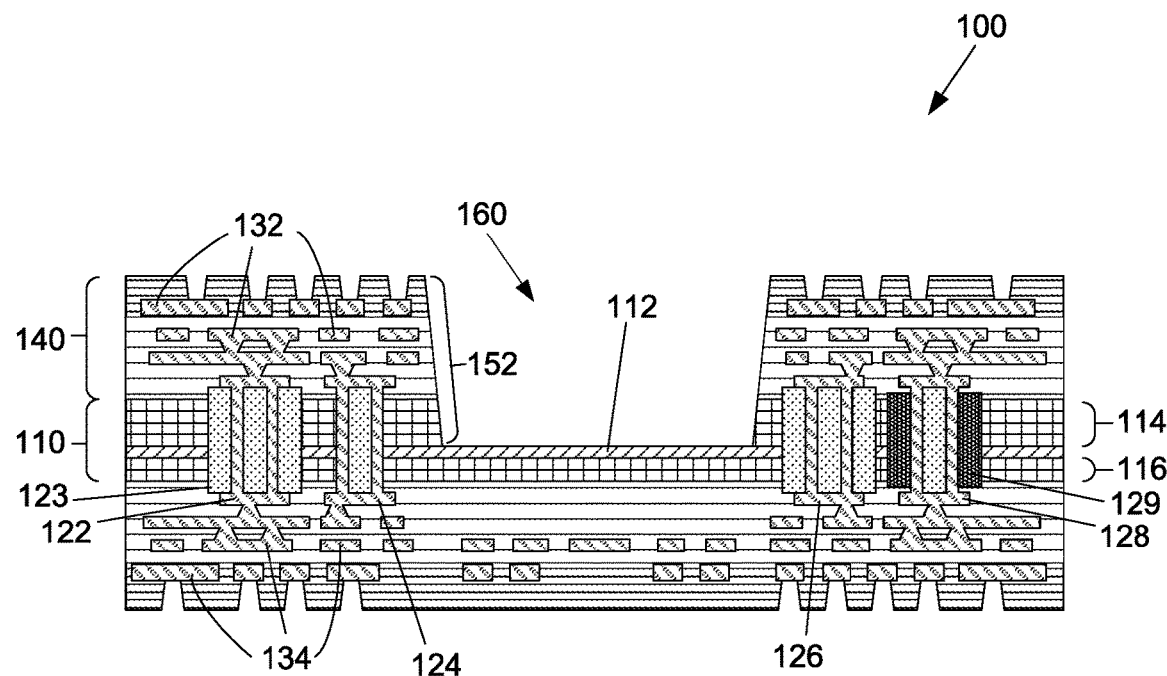
FIG. 1 is a side cross-sectional view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Some embodiments provide technology for a package substrate with in-core foils for ultra-deep open cavities for thick components (e.g., High Band Width (HBM) components, photonic ICs (PICs), etc.). Heterogeneous integration may involve the use of many different silicon chips with many different sizes. For example, Embedded Multi-die Interconnect Bridge (EMIB) and other 2.5D packaging technology provides a cost-effective approach to in-package high density interconnect of heterogeneous chips. A problem occurs with very thick components (e.g., greater than about 400 um), such as HBM chips, silicon PICs, etc. (e.g., which may be about 700 um), which limits the capability to embed these components with conventional packaging technology.

Conventional packaging technology may support a cavity that is about 300-400 um deep, which is not suitable to embed a 700 um thick component. For example, a 300 um deep cavity may be formed with a minimum of an 8-2-8 substrate stack up. To support a 700 um deep cavity, conventional cavity methodologies would theoretically require a substrate that has a stack 16-2-16. Such thicknesses are not practical or possible for conventional substrate manufacturing factories without making significant investments to process such thick panels, and may still be problematic with respect to the overall yield of the package.

To overcome one or more of the foregoing problems, some embodiments utilize an embedded foil in the core to be used as a laser stop. In order to ensure the plated through-holes (PTH) do not short out, some embodiments utilize an insulated PTH to keep the PTHs insulated from the embedded foil. Preferably, the thick component (e.g., HBM) is attached to the core using a compliant material to absorb tolerances in Z height. For example, a quick cure adhesive and/or a solder-based attach may be preferred. A die-attach film (DAF)-based attach may also be utilized, but may be more difficult in terms of Z height tolerance. The large cavity described herein may also be useful to accommodate larger passive components such as inductors, capacitors, etc.

An embodiment of an integrated circuit package 100 may be formed by first forming an electronic substrate, such as a core 110, as shown in FIG. 1. The core 110 may comprise a laminate including a metal layer 112 between a first insulator layer 114 and a second insulator layer 116, one or more metal vias 122, 124, 126 and 128 through the core 110, and metallization features 132 and 134 on a first side and a second side of the core 110. As illustrated in FIG. 1, first ones of the metallization features 132 are embedded within dielectric material 140 on the first side of the core 110, and a sidewall 152 of the dielectric material 140 and of the first insulator layer 114 defines a recess 160 over an area of the metal layer 112.

In some embodiments, a sidewall of the metal via 122 is separated from the metal layer 112 by a dielectric material 123. For example, the metal via 122 may comprise a coaxial plated through-hole. In some embodiments, the metal via 128 may comprise a coaxial metal inductor loop through the core 110, where a sidewall of the coaxial metal inductor loop is separated from the metal layer 112 by a magnetic material 129 (e.g., magnetic paste). For example, a height of the magnetic material along the sidewall of the coaxial metal inductor loop may be different from a height of the dielectric material along the sidewall of the coaxial plated through-hole. In some embodiments, a sidewall of the metal via 124 is in direct contact with the metal layer 112. In some embodiments, as illustrated in FIG. 1, the metal layer 112 is exposed at a bottom of the recess 160.

Figure 2:
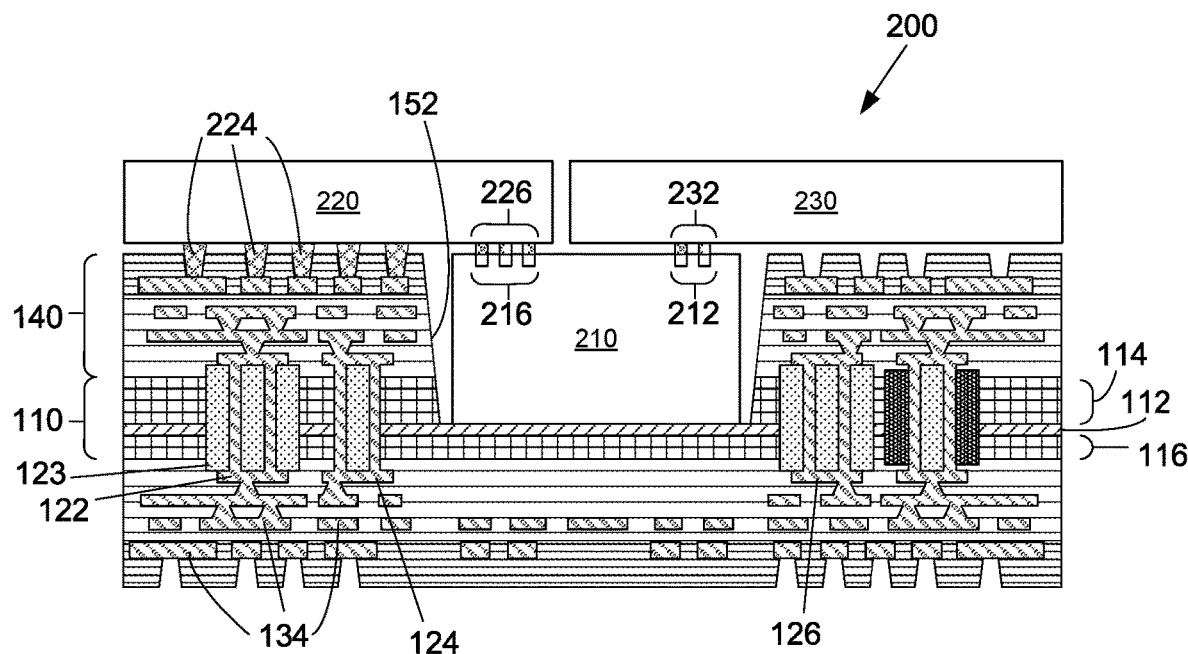
FIG. 2 is a side cross-sectional view of another integrated circuit package, according to one embodiment of the present description.

With reference to FIG. 2, an embodiment of an integrated circuit package 200 may be similarly configured as the integrated circuit package 100, with like numerals indicating like elements. In some embodiments, the first and second insulator layers 114, 116 may comprise a glass-reinforced epoxy resin, and the dielectric material 140 may comprise an organic compound. The first of the metallization features 132 may comprise first interfaces to couple with an integrated circuit (IC) die through first-level interconnect features, and a second of the metallization features 134 on the second side of the core may comprise second interfaces to couple with a host component through second-level interconnect features. As illustrated, the integrated circuit package 200 includes a first integrated circuit (IC) chip 210 within the recess 160, and a second IC chip 220 comprising first terminals 224 coupled to the first interfaces through first ones of the first-level interconnect features, and second terminals 226 coupled to a first terminals 216 of the first IC chip 210.

The integrated circuit package 200 further includes a third IC chip 230 comprising first terminals 232 coupled to a second terminals 212 of the first IC chip 210. Although not shown, the third IC chip 230 may also include second terminals coupled to the first interfaces through second ones of the first-level interconnect features. For example, the first IC chip 210 may include a thick component (e.g., >400 nm) such as a HBM device, a PIC device, etc., and the second IC chip 220 may include a SOC device that includes a processor (e.g. a CPU). For example, the third IC chip 230 may include an accelerator device, a graphics device, a FPGA device, etc.

Advantageously, some embodiments may reduce the need for silicon die in the integration of HBM because the HBM device(s) is/are embedded in a package, as opposed to being individually attached on the top of a substrate, providing potential cost savings. Another advantage is that some embodiments may be manufactured with substrates that keep the number of layers needed on the substrate within conventional and cost-effective capabilities of substrate suppliers, together with the ability to be able to embed a much thicker die in the package, leading to the use of fewer pieces of silicon per package. Some embodiments may also provide a performance benefit due to increased power delivery and quicker interfacing to the HBM. Some embodiments may also advantageously provide more versatility in the heterogeneous design of packages. For example, some embodiments may include multiple HBMs and/or other components of different thicknesses at different locations in the package. Some embodiments may embed more than one metal planes in the core (e.g., non-overlapping) to provide different cavity depths for the different thicknesses.

In some embodiments, the metal layer at the bottom of the cavity may be removed and further metallization layers may be provided in dielectric material on the second side of the core such that the embedded component may act as a bridge. For example, a HBM device may be configured to have extra surface layers for die to die communications and the HBM device may act as both HBM and a bridge. Advantageously, by precisely controlling the depth of the ultra-deep cavity to match the depth of the thick component, some embodiments create a planar top surface and consequently alleviate the need for complex thermal solutions and integrated heat spreaders (e.g., that might otherwise need to account for various die height deltas), which may result in higher performance products at lower cost.

Figure 3:
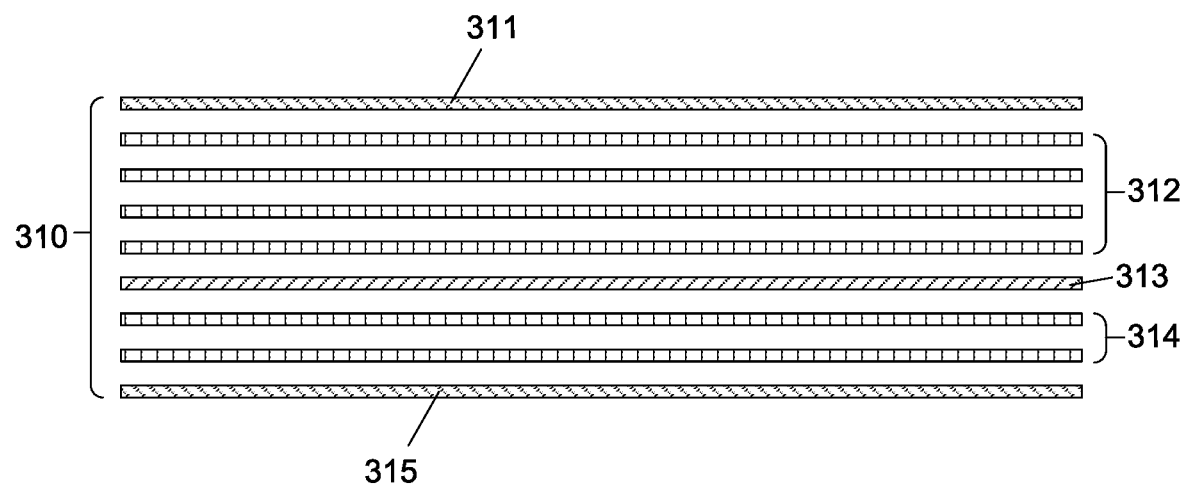
FIGS. 3-17 are side cross-sectional views of a process for fabrication of an integrated circuit package, according to an embodiment of the present description.
Figure 4:
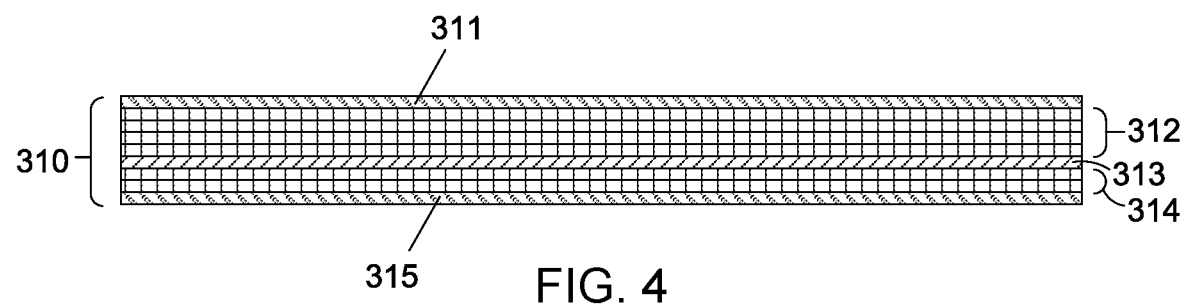
Figure 16:
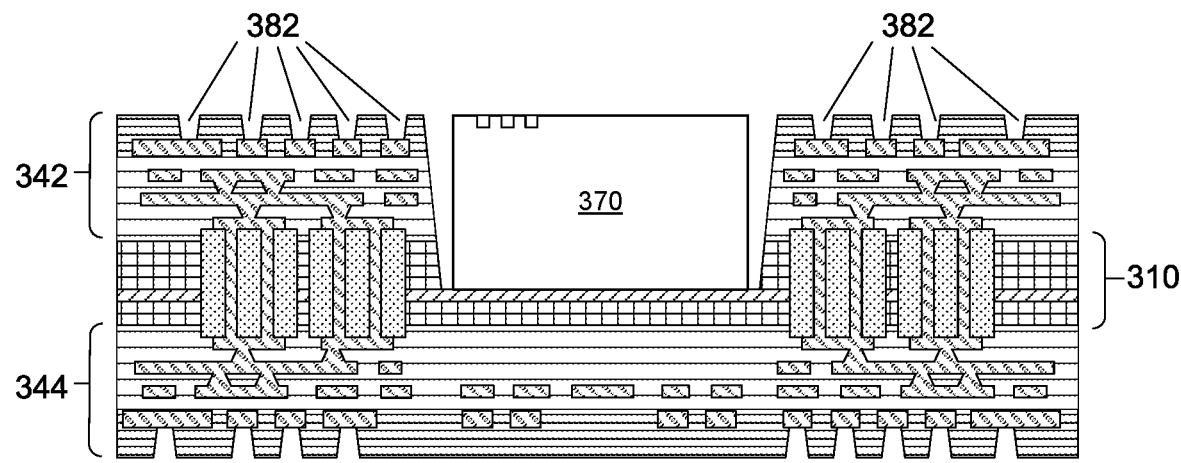
Figure 17:
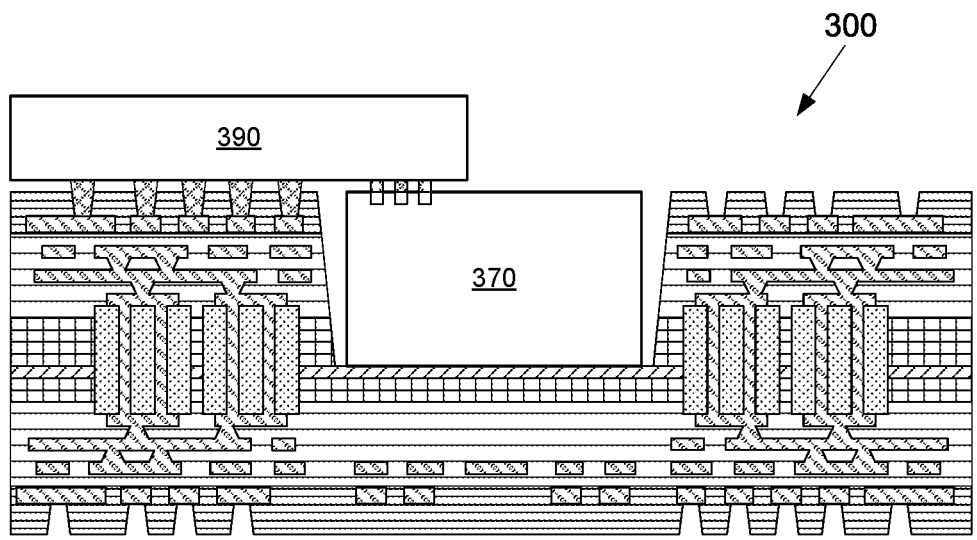

FIGS. 3-17 illustrate one embodiment of the fabrication of an integrated circuit package 300 (see FIG. 17). As illustrated in FIGS. 3 and 4, a substrate stack for a core 310 may include a frontside foil layer 311 attached to one or more layers 312 of dielectric material attached to an embedded foil layer 313 attached to one or more layers 314 of dielectric material attached to a backside foil layer 315. The core 310 may be formed by any known process. The embedded foil layer 313 provides a laser stop layer for subsequent drilling of a cavity for an embedded component. The thickness and number of layers 312 of dielectric material is selected to provide a desired cavity depth above the embedded foil 313, together with whatever additional substrate and/or materials are to be applied on top of the core 310. Any suitable materials may be utilized for the core layers, such as copper for the foil layers 311, 313, and 315, and glass-reinforced epoxy resin for the dielectric layers 312 and 314, and any known process may be utilized to attach the layers to each other. In one embodiment of the present description, the layers are stacked and then pressed together, with copper foil embedded in the core 310 during a pre-preg stack process before a hot press process is used to attached all of the layers of the core to each other.

Figure 5:
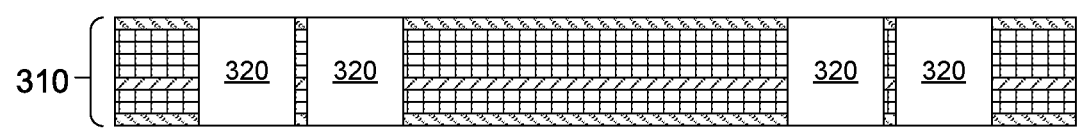
Figure 6:
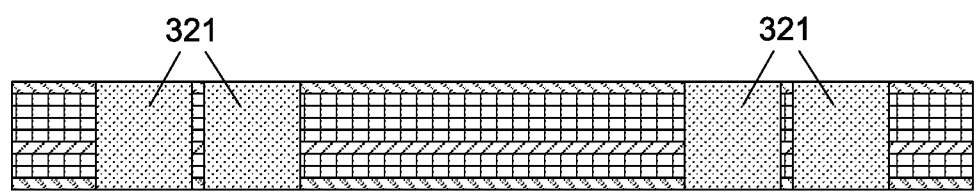
Figure 7:
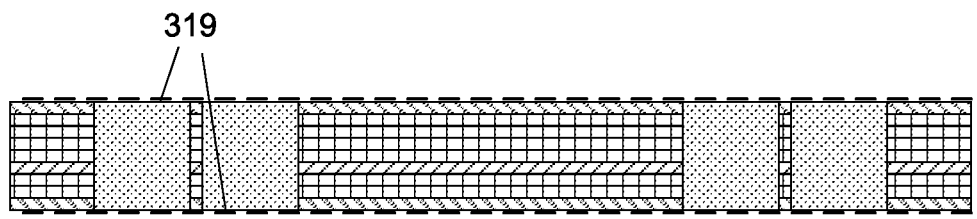
Figure 8:
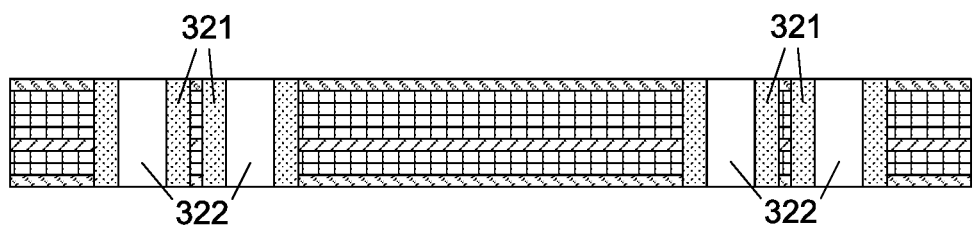

As shown in FIG. 5, at least one outer opening 320 may be formed in the core 310, wherein the at least one outer opening 320 may extend through the core 310. The openings 320 through the core 310 may be formed by any known process. In one embodiment of the present description, the openings 320 may be formed by a through hole drill and desmear process. As shown in FIG. 6, the openings 320 may be filled with a dielectric material 321. As shown in FIGS. 7 and 8, protection metal 319 (e.g., copper) may be applied and at least one inner opening 322 may be formed in the dielectric material 321. The inner openings 322 through the dielectric material 321 may be formed by any known process. In one embodiment of the present description, the openings 322 may be formed by a through hole drill and desmear process.

Figure 9:
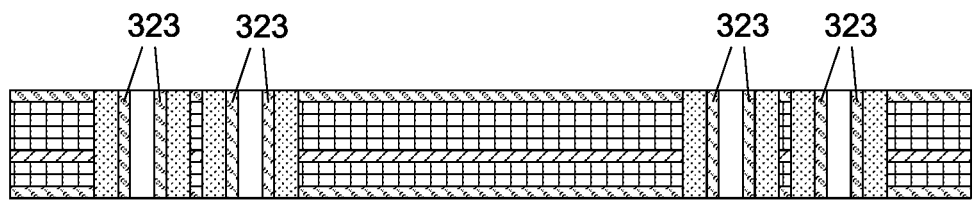
Figure 10:
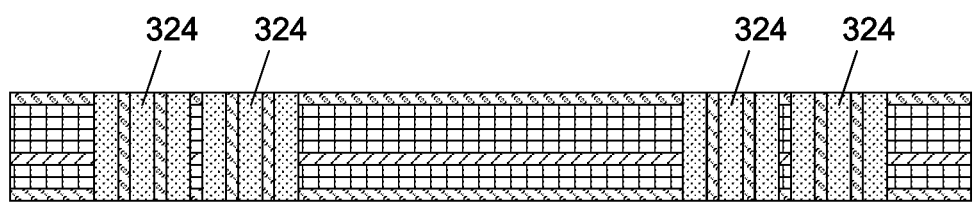

As shown in FIG. 9, at least one metal sidewall 323 may be attached to the openings 322. Any suitable material may be utilized for the metal sidewalls 323 and the sidewalls 323 may be attached to the openings 322 by any known process. In one embodiment of the present description, copper may be attached to the openings 322 by either an electroplate or an electroless plate process. As shown in FIG. 10, the openings 322 may be filled with a dielectric material 324. Any suitable materials may be used for the dielectric materials 321 and 324, and any known process may be utilized to fill the openings 320 and 322 with the dielectric materials 321 and 324. In some embodiments, the dielectric materials 321 and 324 may be the same material. In one embodiment of the present description, the dielectric materials 312 and 324 may be an epoxy, polyimide, or polycarbonate composite with dielectric fillers, and the openings 320 and 322 may be filled with a plug and grind process. For example, the fillers can be but are not limited to, silica, alumina, carbides, and nitrides.

Figure 11:
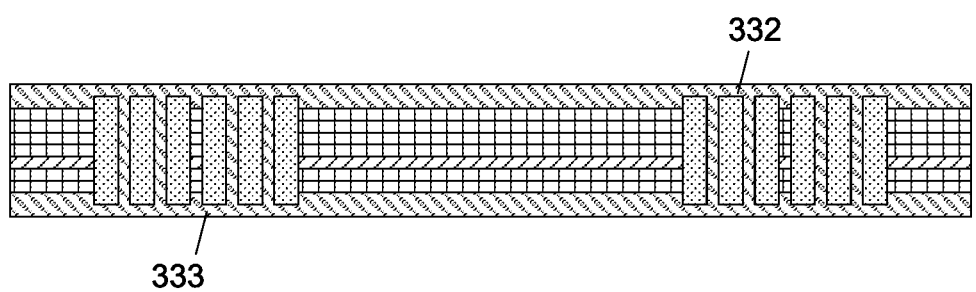
Figure 12:
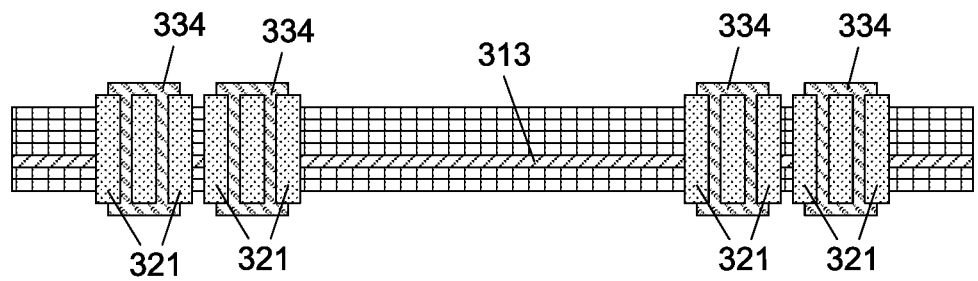

As shown in FIGS. 11 and 12, metal layers 332 and 333 may be attached to the frontside and backside foil layers 311, 315 and the outer metal layers of the core 310 may then be selectively removed to form at least one coaxial plated through-hole 334 in the core 310. Any suitable material may be utilized for the metal layers 332, 333 and any known process may be utilized to attach the metal layers 332, 333 and selectively remove the outer metal layers of the core 310. In one embodiment of the present description, copper may be lid plated on the core 310 and a lithography and etch process may be utilized to selectively remove portions of the outer metal layers of the core 310. The dielectric material 321 ensures that the coaxial plated through-holes 334 are insulated from and don't short out to the embedded foil layer 313.

Figure 13:
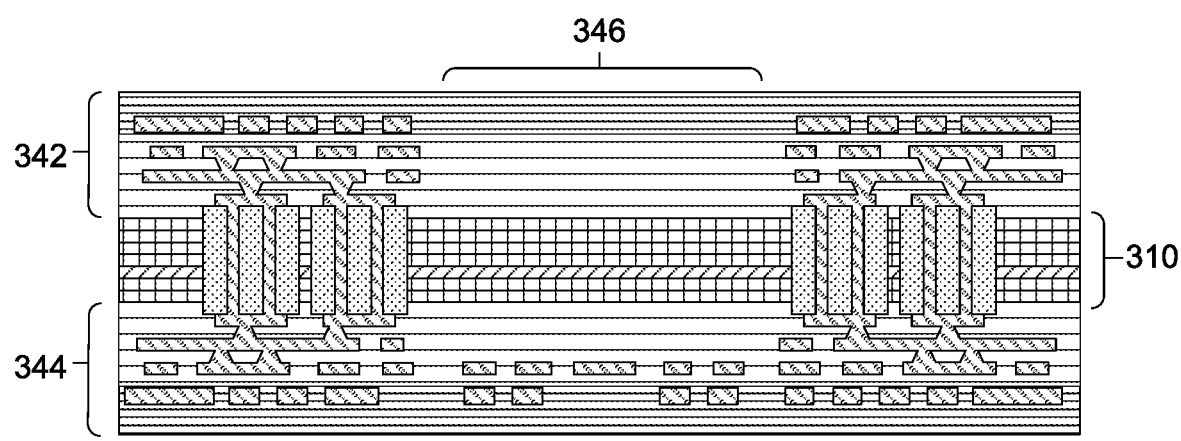
Figure 14:
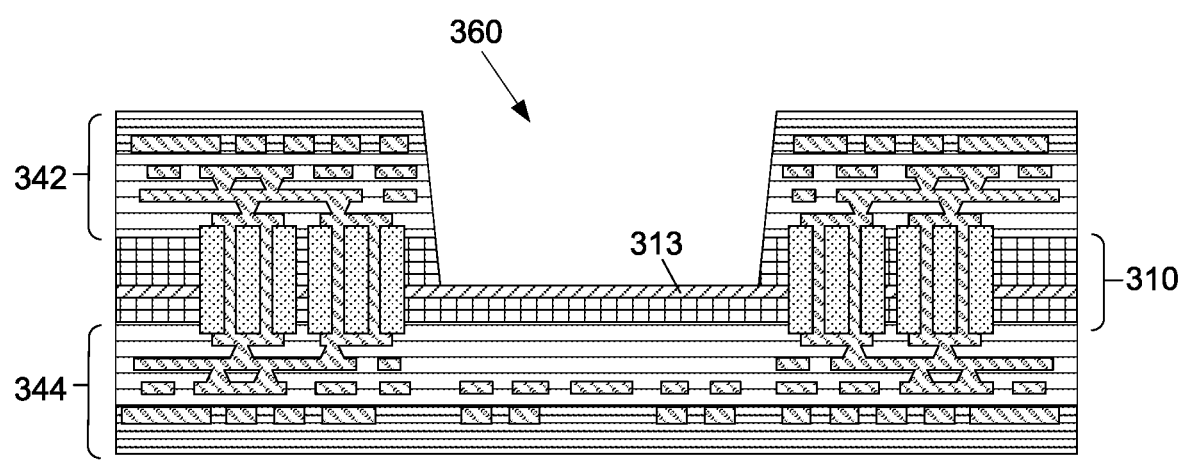
Figure 15:
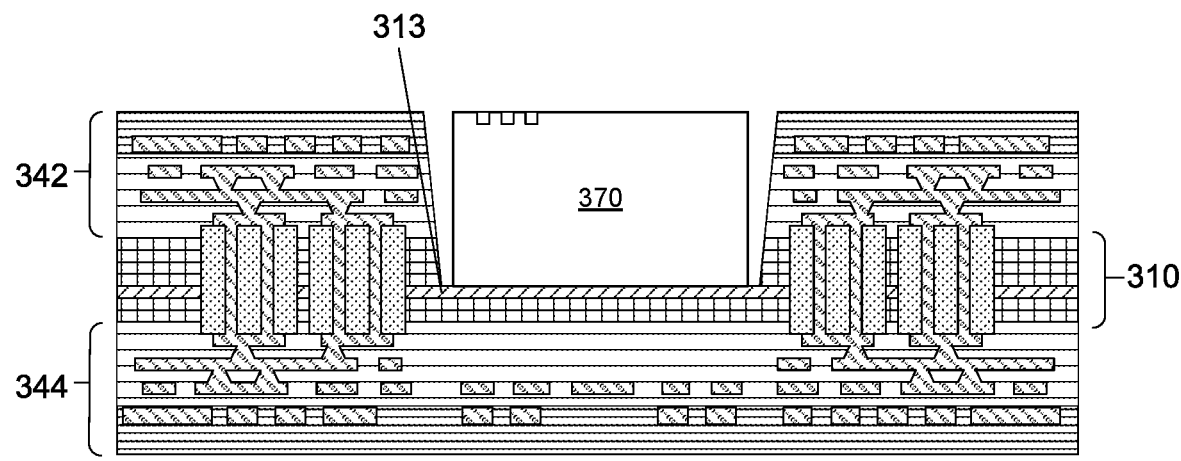

As shown in FIGS. 13 to 15, additional substrate stack-ups 342 and 344 may be attached to the top and bottom of the core 310, as may be needed for mounting and interconnect of the IC devices of the integrated circuit package 300. Any suitable materials may be utilized for the additional substrate stack-ups 342 and 344 and any known process may be utilized to attach the stack-ups 342 and 344 to each other and/or to the core 310. In one embodiment, a semi-additive process may be utilized to attach the stack-ups 342 and 344 to the core 310 up to a solder resist (SR) layer, with a voided area 346 where an opening is to be formed. At least one opening 360 may be formed in the substrate stack-up 342 and the core 310 to provide a cavity for an embedded component 370.

The opening 360 may extend through the stack-up 342 and the core 310 to the embedded foil layer 313. Any known process may be utilized to form the opening(s) 360. In one embodiment of the present description, a large cavity laser drill process may be used to form the opening 360, with the embedded foil layer 313 providing a stop layer for the laser and precisely controlling the depth of the opening 360. Advantageously, embodiments may provide technology to form an ultra-deep cavity in an integrated circuit package (e.g., where a depth of the opening 360 is greater than about 400 um) to accommodate thick IC components (e.g., such as HBM devices, PIC devices, etc.). The component 370 may be attached on top of the embedded foil layer 313. Any suitable material may be utilized to attach the component 370 and any known process may be utilized to attach the component 370. In one embodiment of the present description, a compliant material is utilized to absorb tolerances in Z height (e.g., a quick cure adhesive, solder, etc.) along with a process suitable for that material (e.g., a cure process, a solder-based process, etc.).

Figure 18:
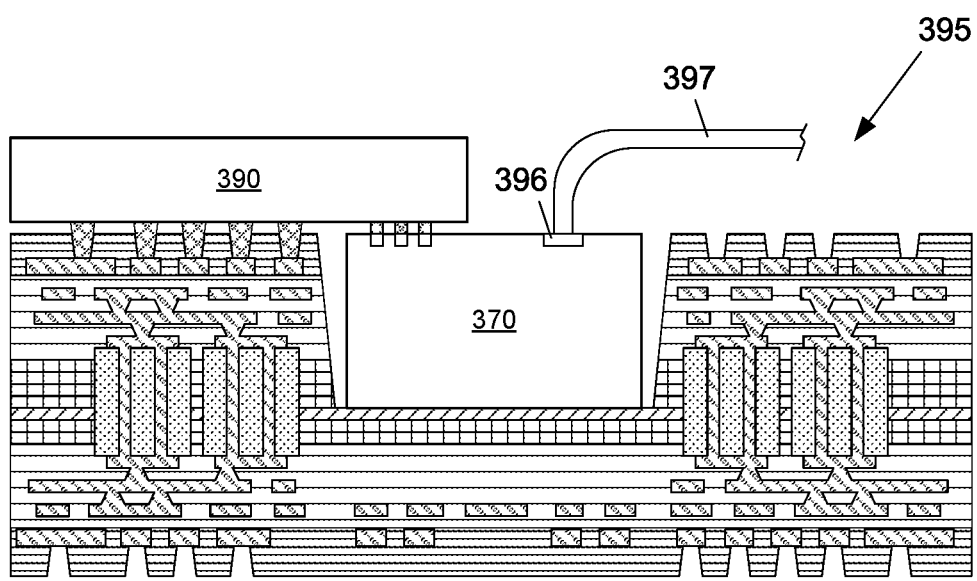
FIG. 18 is a side cross-sectional view of another integrated circuit package, according to one embodiment of the present description.

As shown in FIGS. 16 and 17, at least one solder resist opening (SRO) 382 is formed in the top of the substrate stack-up 342 to expose first level interconnects, and at least one IC chip 390 is attached to the first level interconnects and/or the component 370. FIG. 18 shows an embodiment of an integrated circuit package 395 where the component 370 comprises a PIC with an optical interface 396 coupled to a fiber optic cable 397.

Any suitable material and any known process may be utilized to attached to the IC chip 390 to the first level interconnects and/or the component 370. In one embodiment of the present description, a plurality of substrate-to-board bond pads may be formed on the at least one dielectric layer and electrically attached to respective conductive vias. External interconnects, such as solder, may be attached to the substrate-to-board pond pads. The external interconnects may be used to attach the integrated circuit package 300 to an external substrate (not shown), such as a motherboard. The substrate stack-ups 342 and 344 may comprise a plurality of dielectric material layers, which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive traces, bond pads, and the conductive vias may be made of any appropriate conductive material, including, but not limited to, metals, such as copper, silver, nickel, gold, aluminum, alloys thereof, and the like.

As further shown in FIGS. 17 and 18, a plurality of integrated circuit devices (illustrated as a first IC device 370 and a second IC device 390) may be electrically attached to the electronic substrate. The first IC device 370 and the second IC device 390 (as well as any further IC devices that may be utilized) may be any appropriate device, including, but not limited to, a microprocessor, a chipset, a graphics device, a wireless device, a memory device, an application specific integrated circuit device, combinations thereof, stacks thereof, and the like. The first IC device 370 and the second IC device 390 may be attached to the electronic substrate through a plurality of device-to-substrate interconnects, such as reflowable solder bumps or balls, in a configuration generally known as a flip-chip or controlled collapse chip connection ("C4") configuration. The device-to-substrate interconnects may extend between bond pads on a first surface of the first IC device 370 and corresponding device-to-substrate bond pads, and between the first IC device bond pads and corresponding high-density device-to-substrate bond pads to form electrical connections therebetween. The device-to-substrate interconnects may also extend between bond pads on a first surface of the second IC device 390 and corresponding device-to-substrate bond pads, and between the second IC device bond pads and corresponding high-density device-to-substrate bond pads to form electrical connections therebetween. It is understood that the first integrated circuit device bond pads may be in electrical communication with integrated circuitry (not shown) within the first IC device 370, and that the second IC device bond pads may be in electrical communication with integrated circuitry (not shown) within the second IC device 390.

The device-to-substrate interconnects may be any appropriate electrically conductive material or structure, including but not limited to, solder balls, metal bumps or pillars, metal filled epoxies, or a combination thereof. In one embodiment of the present description, the device-to-substrate interconnects may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment of the present description, the device-to-substrate interconnects may be copper bumps or pillars. In a further embodiment of the present description, the device-to-substrate interconnects may be metal bumps or pillars coated with a solder material.

In one embodiment of the present description, an underfill material, such as an epoxy material, may be disposed between the electronic substrate and the IC devices 370 and 390, and surrounding the plurality of device-to-substrate interconnects. As will be understood to those skilled in the art, the underfill material may be dispensed between the first surfaces of the IC devices 370, 390, respectively, and the electronic substrate as a viscous liquid and then hardened with a curing process. The underfill material may also be a molded underfill material. The underfill material may provide structural integrity and may prevent contamination, as will be understood to those skilled in the art. An encapsulation material may be disposed over and between the integrated circuit devices 370, 390 for further structural integrity and contamination prevention.

Figure 19:
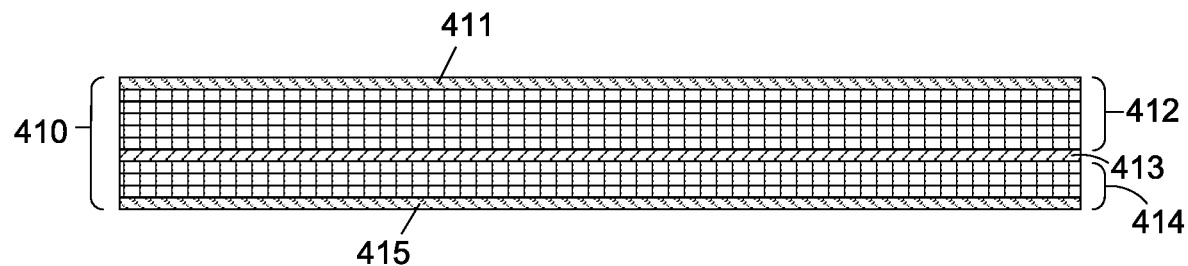
FIGS. 19-34 are side cross-sectional views of a process for fabrication another integrated circuit package, according to another embodiment of the present description.
Figure 33:
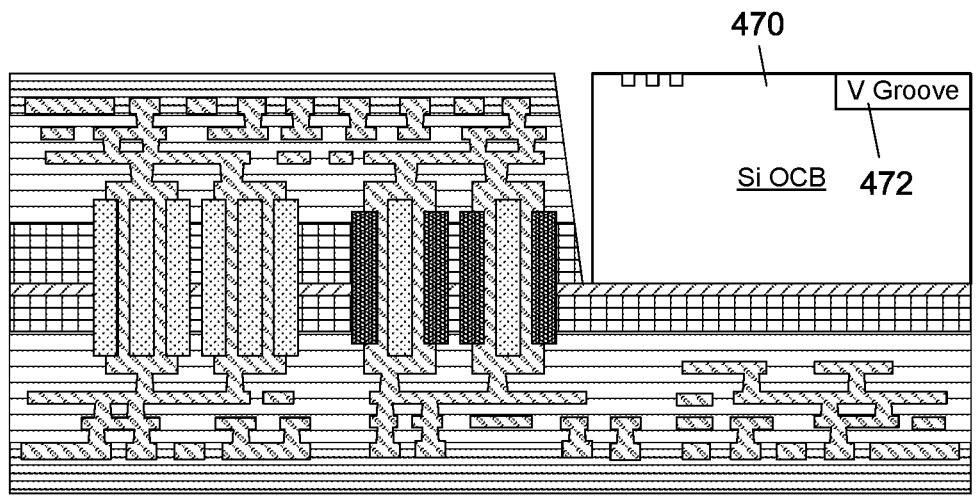
Figure 34:
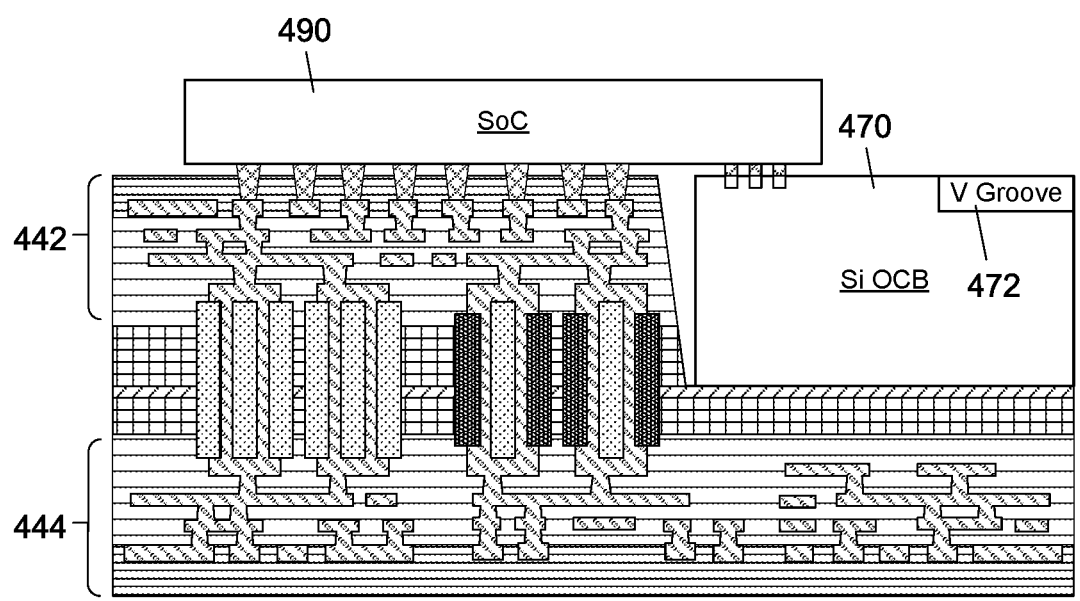

FIGS. 19-34 illustrate one embodiment of the fabrication of an integrated circuit package 400 (see FIG. 34). As illustrated in FIG. 19, a substrate stack for a core 410 may include a frontside foil layer 411 attached to one or more layers 412 of dielectric material attached to an embedded foil layer 413 attached to one or more layers 414 of dielectric material attached to a backside foil layer 415. The core 410 may be formed by any known process. The embedded foil layer 413 provides a laser stop layer for subsequent drilling of a cavity for an embedded component. The thickness and number of layers 412 of dielectric material is selected to provide a desired cavity depth above the embedded foil 413, together with whatever additional substrate and/or materials are to be applied on top of the core 410. Any suitable materials may be utilized for the core layers, such as copper for the foil layers 411, 413, and 415, and glass-reinforced epoxy resin for the dielectric layers 412 and 414, and any known process may be utilized to attach the layers to each other. In one embodiment of the present description, the layers are stacked and then pressed together, with copper foil embedded in the core 410 during a pre-preg stack process before a hot press process is used to attached all of the layers of the core to each other.

Figure 20:
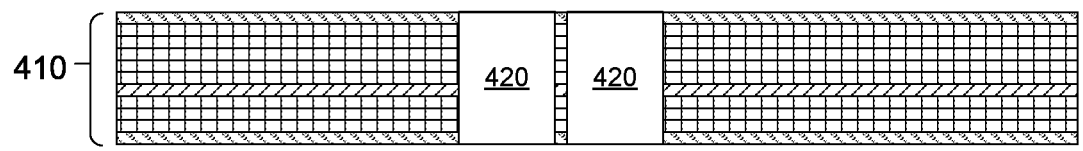
Figure 21:
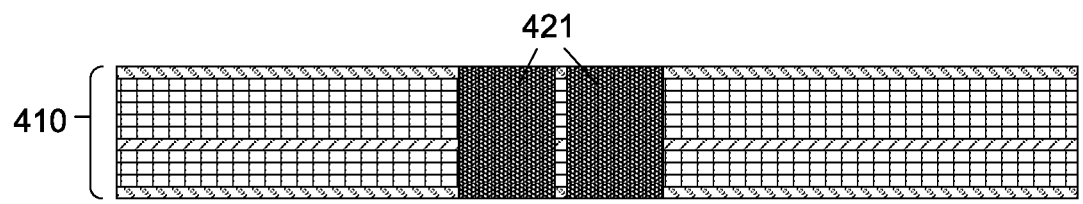
Figure 22:
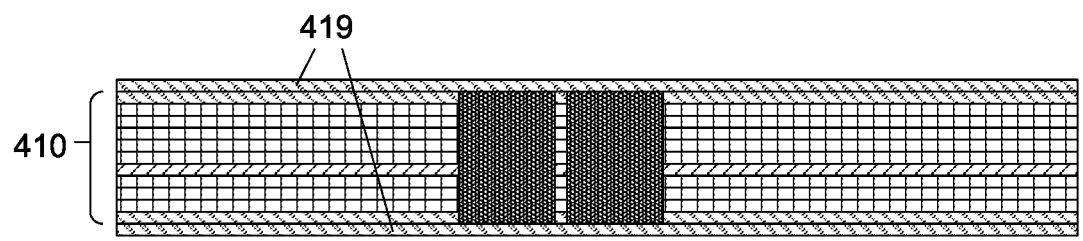

As shown in FIG. 20, at least one outer opening 420 may be formed in the core 410, wherein the at least one outer opening 420 may extend through the core 410. The openings 420 through the core 410 may be formed by any known process. In one embodiment of the present description, the openings 420 may be formed by a through hole drill and desmear process. As shown in FIG. 21, the openings 420 may be filled with a magnetic material 421. Any suitable material may be used for the magnetic material 421 and any known process may be utilized to fill the openings 420 with the magnetic material 421. In one embodiment of the present description, magnetic paste may be utilized for the magnetic material 421 the openings 420 may be filled with a plug, cure, and grind process. As shown in FIG. 22, protection metal 419 (e.g., copper) may be applied on both sides of the core 410.

Figure 23:
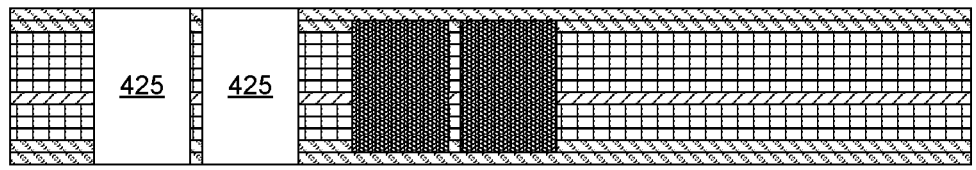
Figure 24:
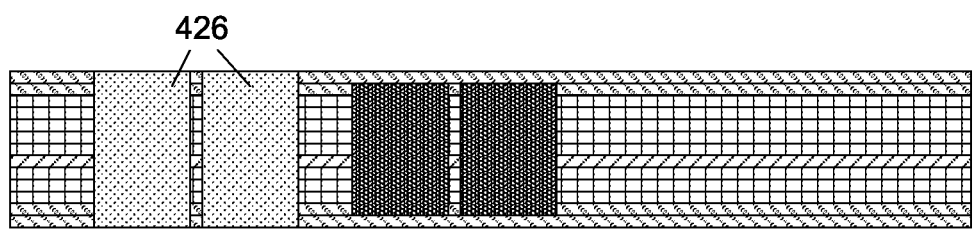

As shown in FIGS. 23 and 24, at least one outer opening 425 may be formed in the core 410, wherein the at least one outer opening 425 may extend through the core 410 and protection metal 419. The openings 425 may be formed by any known process. In one embodiment of the present description, the openings 425 may be formed by a through hole drill and desmear process. The openings 425 may be filled with a dielectric material 426. Any suitable material may be used for the dielectric material 426 and any known process may be utilized to fill the openings 425 with the dielectric material 426. In one embodiment of the present description, the openings 425 may be filled with a plug and grind process.

Figure 25:
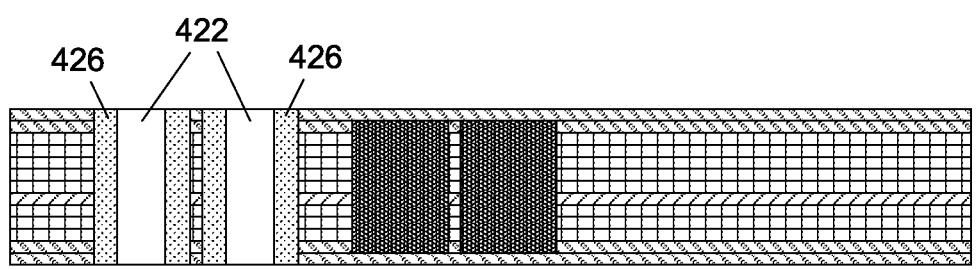
Figure 26:
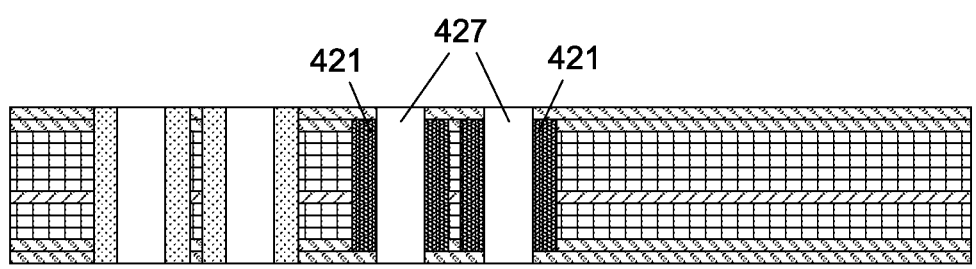

As shown in FIG. 25, at least one inner opening 422 may be formed in the dielectric material 426. The inner openings 422 through the dielectric material 426 may be formed by any known process. In one embodiment of the present description, the openings 422 may be formed by a through hole drill and desmear process. As shown in FIG. 26, at least one inner opening 427 may be formed in the magnetic material 421. The inner openings 427 through the magnetic material 421 may be formed by any known process. In one embodiment of the present description, the openings 427 may be formed by a through hole drill and high pressure water rinse process.

Figure 27:
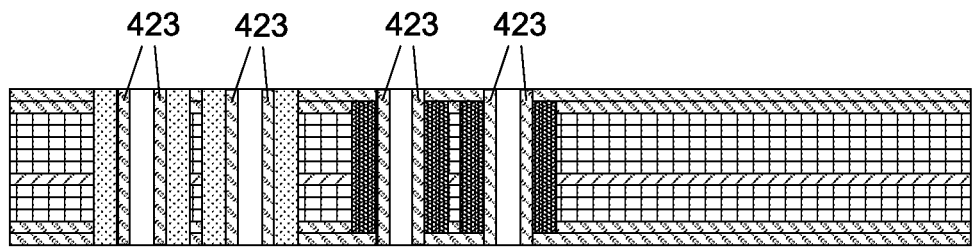
Figure 28:
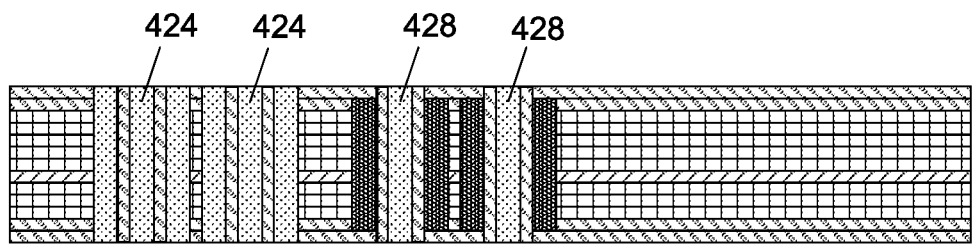

As shown in FIG. 27, at least one metal sidewall 423 may be attached to the openings 422 and 427. Any suitable material may be utilized for the metal sidewalls 423 and the sidewalls 423 may be attached to the openings 422 and 427 by any known process. In one embodiment of the present description, copper may be attached to the openings 422 and 427 by either an electroplate or an electroless plate process. As shown in FIG. 28, the openings 422 and 427 may be filled with dielectric material 424 and 428. Any suitable materials may be used for the dielectric materials 424 and 428, and any known process may be utilized to fill the openings 422 and 427 with the dielectric materials 424 and 428. In some embodiments, the dielectric materials 424 and 428 may be the same material (e.g., and may also be the same material as the dielectric material 426. In one embodiment of the present description, the dielectric materials 424, 426, and 428 may be an epoxy, polyimide, or polycarbonate composite with dielectric fillers, and the openings 422 and 427 may be filled with a plug and grind process. For example, the fillers can be but are not limited to, silica, alumina, carbides, and nitrides.

Figure 29:
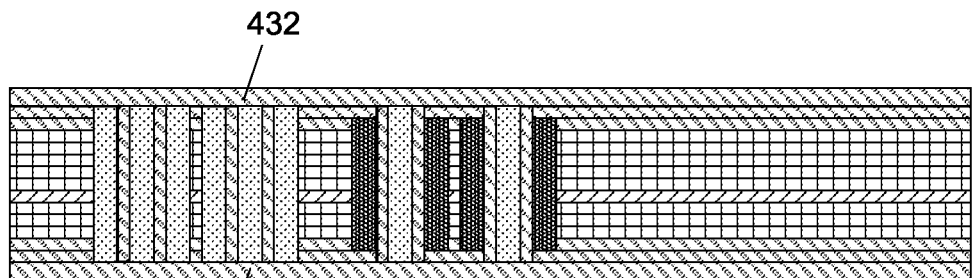
Figure 30:
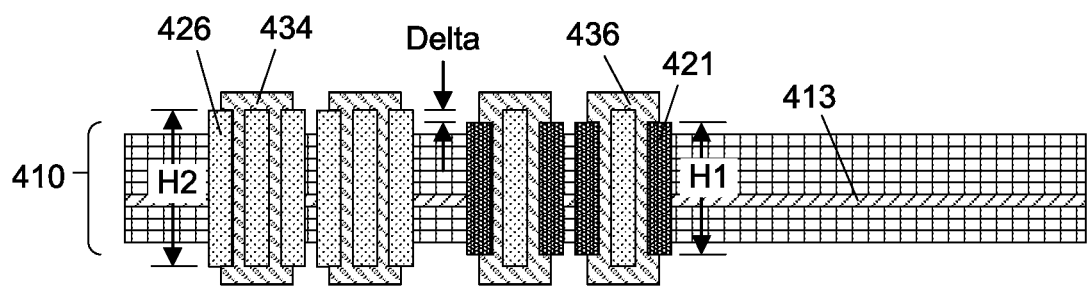

As shown in FIGS. 29 and 30, metal layers 432 and 433 may be attached to the frontside and backside foil layers 411, 415 (e.g., and the protection metal 419) and the outer metal layers of the core 410 may then be selectively removed to form at least one coaxial plated through-hole 434 and at least one coaxial metal inductor loop 436 in the core 410. Any suitable material may be utilized for the metal layers 432, 433 and any known process may be utilized to attach the metal layers 432, 433 and selectively remove the outer metal layers of the core 410. In one embodiment of the present description, copper may be lid plated on the core 410 and a lithography and etch process may be utilized to selectively remove portions of the outer metal layers of the core 410. The dielectric material 426 ensures that the coaxial plated through-holes 434 are insulated from and don't short out to the embedded foil layer 413. The magnetic material 421 ensures that the coaxial metal inductor loops 436 are insulated from and don't short out to the embedded foil layer 413.

As shown in FIG. 30, a height H1 of the magnetic material 421 is different from a height H2 of the dielectric material 426, providing a height delta between respective shoulders of the magnetic material 421 and the dielectric material 426 with respect to conductive pads of the coaxial plated through-holes 434 and the coaxial metal inductor loops 436.

Figure 31:
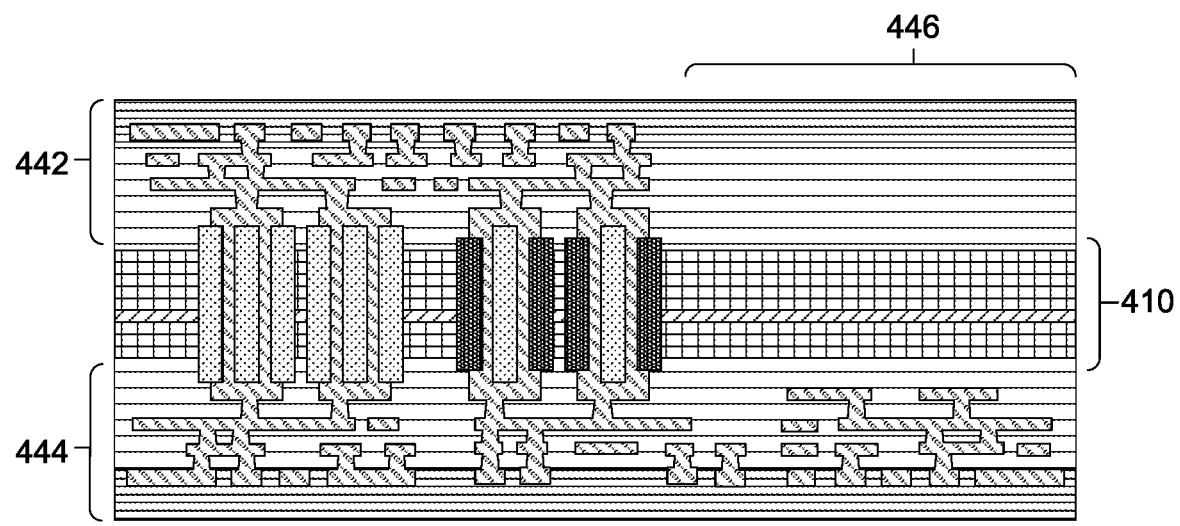
Figure 32:
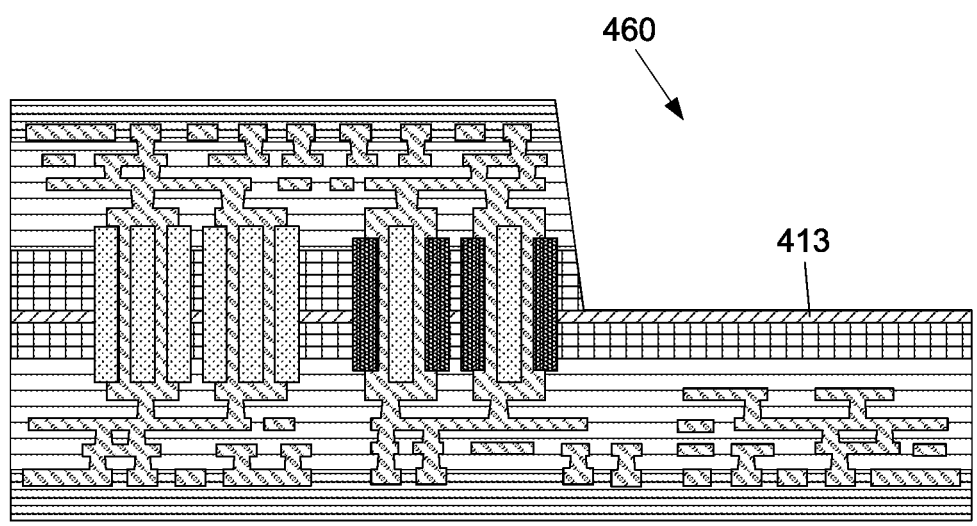

As shown in FIGS. 31 to 33, additional substrate stack-ups 442 and 444 may be attached to the top and bottom of the core 410, as may be needed for mounting and interconnect of the IC devices of the integrated circuit package 400. Any suitable materials may be utilized for the additional substrate stack-ups 442 and 444 and any known process may be utilized to attach the stack-ups 442 and 444 to each other and/or to the core 410. In one embodiment, a semi-additive process may be utilized to attach the stack-ups 442 and 444 to the core 410 up to a solder resist (SR) layer, with a voided area 446 where an opening is to be formed at an edge of the package 400. At least one opening 460 may be formed in the substrate stack-up 442 and the core 410 to provide a cavity for an embedded component 470.

The opening 460 may extend through the stack-up 442 and the core 410 to the embedded foil layer 413. Any known process may be utilized to form the opening(s) 460. In one embodiment of the present description, a large cavity laser drill process may be used to form the opening 460, with the embedded foil layer 413 providing a stop layer for the laser and precisely controlling the depth of the opening 460. Advantageously, embodiments may provide technology to form an ultra-deep cavity in an integrated circuit package (e.g., where a depth of the opening 460 is greater than about 400 um) to accommodate thick IC components (e.g., such as HBM devices, PIC devices, etc.). The component 470 may be attached on top of the embedded foil layer 413. Any suitable material may be utilized to attach the component 470 and any known process may be utilized to attach the component 470. In one embodiment of the present description, a compliant material is utilized to absorb tolerances in Z height (e.g., a quick cure adhesive, solder, etc.) along with a process suitable for that material (e.g., a cure process, a solder-based process, etc.).

For example, the embedded component 470 may comprise a silicon optical contact board (Si OCB) with a V-groove 472. For example, PIC integration may benefit from embodiments that provide a thick component embedding capability (e.g., about 400 to 700 um, and above). In particular, it may be difficult to make a PIC with a V-groove thinner. Accordingly, some embodiments may be particularly beneficial in providing a thick edge cavity for a multi-chip integrated circuit package that includes a V-groove based PIC.

For non-V-groove based PICs, thick silicon may be preferred to reduce warpage concerns for lens attach, fiber assembly at tight pitch (e.g., about 127 um or lower) to enable ultra-high bandwidth, etc. In one embodiment of the present description, a copper foil plane at the bottom of the ultra-deep cavity enables solder-based attach or adhesive-based attach which can enable Z-height control of the PIC for a PIC-to-SOC attach at a tight pitch (e.g., about 45 um pitch or lower). In some embodiments, the embedded foil may be utilized for power delivery by attaching the embedded foil in the core to one or more metal vias through the core.

As shown in FIG. 34, at least one SRO is formed in the top of the substrate stack-up 442 to expose first level interconnects, and at least one IC chip 490 is attached to the first level interconnects and/or the component 470. Any suitable material and any known process may be utilized to attached to the IC chip 490 to the first level interconnects and/or the component 470.

Figure 35:
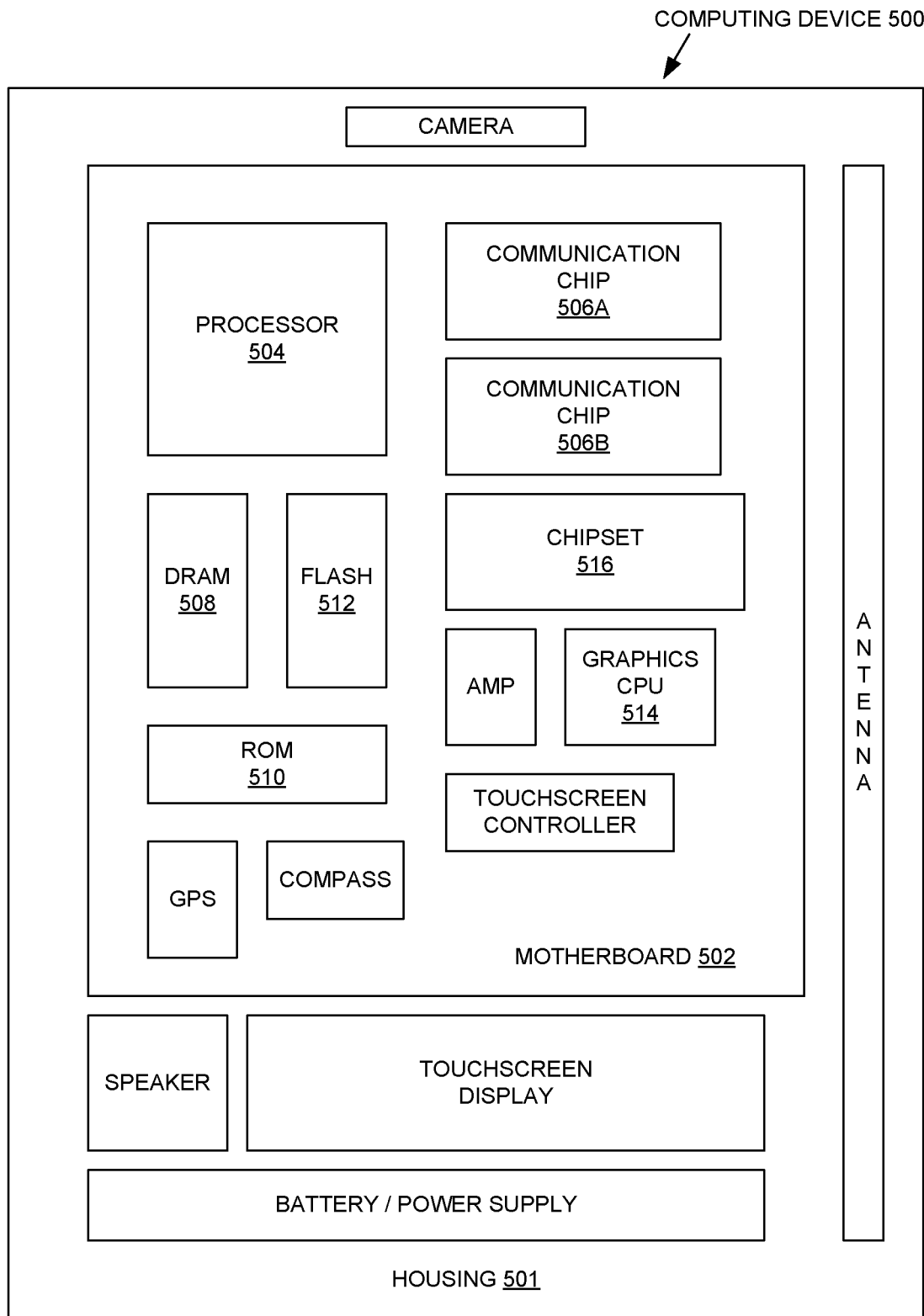
FIG. 35 is an electronic system, according to one embodiment of the present description.

FIG. 35 illustrates an electronic or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery/power supply, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package including a core comprising a laminate including a metal layer between a first insulator layer and a second insulator layer, a metal via through the core, and metallization features on a first side and a second side of the core, wherein first ones of the metallization features are embedded within dielectric material on the first side of the core, and wherein a sidewall of the dielectric material and of the first insulator layer defines a recess over an area of the metal layer (e.g., and one or more of the other features or aspects of the embodiments described herein).

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-35. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus comprising a core comprising a laminate including a metal layer between a first insulator layer and a second insulator layer, a metal via through the core, and metallization features on a first side and a second side of the core, wherein first ones of the metallization features are embedded within dielectric material on the first side of the core, wherein a sidewall of the dielectric material and of the first insulator layer defines a recess over an area of the metal layer.

In Example 2, the subject matter of Example 1 can optionally include a sidewall of the metal via being separated from the metal layer by a dielectric material.

In Example 3, the subject matter of Example 2 can optionally include the metal via comprising a coaxial plated through-hole.

In Example 4, the subject matter of Example 3 can optionally further comprise a coaxial metal inductor loop through the core, wherein a sidewall of the coaxial metal inductor loop is separated from the metal layer by a magnetic material.

In Example 5. The apparatus of Example 4 can optionally include a height of the magnetic material along the sidewall of the coaxial metal inductor loop being different from a height of the dielectric material along the sidewall of the coaxial plated through-hole.

In Example 6, the subject matter of any of Examples 1 to 5 can optionally include a sidewall of the metal via being in direct contact with the metal layer.

In Example 7, the subject matter of any of Examples 1 to 6 can optionally include the metal layer being exposed at a bottom of the recess.

In Example 8, the subject matter of any of Examples 1 to 7 can optionally include the first and second insulator layers comprising a glass-reinforced epoxy resin, the dielectric material comprises an organic compound, the first of the metallization features comprising first interfaces to couple with an integrated circuit (IC) die through first-level interconnect features, and a second of the metallization features on the second side of the core comprising second interfaces to couple with a host component through second-level interconnect features.

In Example 9, the subject matter of Example 8 can optionally further comprise a first integrated circuit (IC) chip within the recess, and a second IC chip comprising first terminals coupled to the first interfaces through first ones of the first-level interconnect features, and second terminals coupled to a first terminals of the first IC chip.

Example 10 is an apparatus comprising a core comprising a laminate including a metal layer between a first insulator layer and a second insulator layer, a metal via through the core, metallization features on a first side and a second side of the core, wherein first ones of the metallization features are embedded within dielectric material on the first side of the core and comprise first interfaces to couple with one or more integrated circuit (IC) devices through first-level interconnect features, wherein a sidewall of the dielectric material and of the first structural layer defines a recess over an area of the metal layer, and one or more IC devices comprising respective terminals coupled to the first interfaces through first ones of the first-level interconnect features.

In Example 11, the subject matter of Example 10, can optionally further comprise a first integrated circuit (IC) chip within the recess, and a second IC chip of the one or more IC devices comprise first terminals coupled to the first interfaces through first ones of the first-level interconnect features, and second terminals coupled to a first terminals of the first IC chip.

In Example 12, the subject matter of any of Examples 10 to 11 can optionally include a sidewall of the metal via being separated from the metal layer by a dielectric material.

In Example 13, the subject matter of Example 12 can optionally include the metal via comprising a coaxial plated through-hole.

In Example 14, the subject matter of Example 13 can optionally further comprise a coaxial metal inductor loop through the core, wherein a sidewall of the coaxial metal inductor loop is separated from the metal layer by a magnetic material.

In Example 15 the subject matter of Example 14 can optionally include a height of the magnetic material along the sidewall of the coaxial metal inductor loop being different from a height of the dielectric material along the sidewall of the coaxial plated through-hole.

Example 16 is an electronic system comprising a board, a power supply to provide power to one or more integrated circuit (IC) chips, and an integrated circuit package electrically attached to the board and the power supply, wherein the integrated circuit package comprises a core comprising a laminate including a metal layer between a first insulator layer and a second insulator layer, a metal via through the core, metallization features on a first side and a second side of the core, wherein first ones of the metallization features are embedded within dielectric material on the first side of the core and comprise first interfaces to couple with one or more integrated circuit (IC) devices through first-level interconnect features, wherein a sidewall of the dielectric material and of the first structural layer defines a recess over an area of the metal layer, a first integrated circuit (IC) chip within the recess, and a second IC chip comprising first terminals coupled to the first interfaces through first ones of the first-level interconnect features, and second terminals coupled to a first terminals of the first IC chip.

In Example 17, the subject matter of Example 16 can optionally include a sidewall of the metal via being separated from the metal layer by a dielectric material.

In Example 18, the subject matter of Example 17 can optionally include the metal via comprising a coaxial plated through-hole.

In Example 19, the subject matter of Example 18 can optionally further comprise a coaxial metal inductor loop through the core, wherein a sidewall of the coaxial metal inductor loop is separated from the metal layer by a magnetic material.

In Example 20, the subject matter of Example 19 can optionally include a height of the magnetic material along the sidewall of the coaxial metal inductor loop being different from a height of the dielectric material along the sidewall of the coaxial plated through-hole.

Example 21 is an apparatus comprising a first substrate having a first surface and an opposing second surface, a second substrate having a first surface and an opposing second surface, and a core substrate having a first surface abutting the second surface of the first substrate and an opposing second surface abutting the first surface of the second substrate, the core substrate comprising a first dielectric layer having a first surface and an opposing second surface, a second dielectric layer having a first surface and an opposing second surface, and a laser stop layer abutting the second surface of the first dielectric layer and abutting the first surface of the second dielectric layer, wherein the first substrate and the core substrate include an opening extending from the second surface of the first dielectric layer at the laser stop layer to the first surface of the first substrate.

In Example 22, the subject matter of Example 21 can optionally further comprise an integrated circuit disposed with the opening of the first substrate and the core substrate, wherein the integrated circuit is coupled to the laser stop layer.

In Example 23, the subject matter of any of Examples 21 to 22, wherein the laser stop layer comprises a metal foil material.

In Example 24, the subject matter of Example 23 can optionally further include a conductive via through the first dielectric layer, the laser stop layer, and the second dielectric layer, wherein the conductive via is electrically connected to the laser stop layer.

In Example 25, the subject matter of any of Examples 23 to 24 can optionally further include a conductive via through the first dielectric layer, the laser stop layer, and the second dielectric layer, wherein the conductive via is electrically insulated from the laser stop layer.

In Example 26, the subject matter of Example 25 can optionally include the conductive via comprising a coaxial plated through-hole.

In Example 27, the subject matter of Example 26 can optionally further include a coaxial metal inductor loop through the first dielectric layer, the laser stop layer, and the second dielectric layer, wherein the coaxial metal inductor loop is magnetically insulated from the laser stop layer.

In Example 28. The apparatus of Example 27 can optionally include a height of magnetic material for the coaxial metal inductor loop in the core substrate being different from a height of insulator material for the coaxial plated through-hole in the core substrate.

Example 29 is an apparatus comprising a substrate stack, and one or more integrated circuit devices electrically attached to the substrate stack, wherein the substrate stack comprises a first substrate having a first surface and an opposing second surface, a second substrate having a first surface and an opposing second surface, and a core substrate having a first surface abutting the second surface of the first substrate and an opposing second surface abutting the first surface of the second substrate, the core substrate comprising a first dielectric layer having a first surface and an opposing second surface, a second dielectric layer having a first surface and an opposing second surface, and a laser stop layer abutting the second surface of the first dielectric layer and abutting the first surface of the second dielectric layer, wherein the first substrate and the core substrate include an opening extending from the second surface of the first dielectric layer at the laser stop layer to the first surface of the first substrate.

In Example 30, the subject matter of Example 29 can optionally further comprise an embedded integrated circuit disposed with the opening of the first substrate and the core substrate, wherein the embedded integrated circuit is connected to at least one of the one or more integrated circuit devices.

In Example 31, the subject matter of any of Examples 29 to 30 can optionally include the laser stop layer comprising a metal foil material.

In Example 32, the subject matter of Example 31 can optionally further include a coaxial plated through-hole through the first dielectric layer, the laser stop layer, and the second dielectric layer, wherein the coaxial plated through-hole is electrically insulated from the laser stop layer.

In Example 33, the subject matter of Example 32 can optionally further include a coaxial metal inductor loop through the first dielectric layer, the laser stop layer, and the second dielectric layer, wherein the coaxial metal inductor loop is magnetically insulated from the laser stop layer.

In Example 34, the subject matter of Example 33 can optionally include a height of magnetic material for the coaxial metal inductor loop in the core substrate being different from a height of insulator material for the coaxial plated through-hole in the core substrate.

In Example 35, the subject matter of any of Examples 29 to 34 can optionally include the core substrate providing a bridge between the first substrate and the second substrate including at least one interconnection route, wherein the at least one integrated circuit device comprises a first integrated circuit device and a second integrated circuit device, and the at least one interconnection route electrically couples the first integrated circuit device and the second integrated circuit device.

Example 36 is an electronic system comprising a board, a power supply, and an integrated circuit package electrically attached to the board and the power supply, wherein the integrated circuit package comprises a substrate stack with an opening, one or more integrated circuit devices electrically attached to the substrate stack, and an embedded integrated circuit disposed with the opening of the substrate stack and connected to at least one of the one or more integrated circuit devices, the substrate stack comprising a first substrate having a first surface and an opposing second surface, a second substrate having a first surface and an opposing second surface, and a core substrate having a first surface abutting the second surface of the first substrate and an opposing second surface abutting the first surface of the second substrate, the core substrate comprising a first dielectric layer having a first surface and an opposing second surface, a second dielectric layer having a first surface and an opposing second surface, and a laser stop layer abutting the second surface of the first dielectric layer and abutting the first surface of the second dielectric layer, wherein the first substrate and the core substrate include the opening of the substrate stack extending from the second surface of the first dielectric layer at the laser stop layer to the first surface of the first substrate.

In Example 37, the subject matter of Example 36 can optionally include the laser stop layer comprises a metal foil material.

In Example 38, the subject matter of Example 37 can optionally further include a coaxial plated through-hole through the first dielectric layer, the laser stop layer, and the second dielectric layer, wherein the coaxial plated through-hole is electrically insulated from the laser stop layer.

In Example 39, the subject matter of Example 38 can optionally further include a coaxial metal inductor loop through the first dielectric layer, the laser stop layer, and the second dielectric layer, wherein the coaxial metal inductor loop is magnetically insulated from the laser stop layer.

In Example 40, the subject matter of Example 39 can optionally include a height of magnetic material for the coaxial metal inductor loop in the core substrate being different from a height of insulator material for the coaxial plated through-hole in the core substrate.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
a core comprising a laminate comprising a metal layer between a first insulator layer and a second insulator layer;
a metal via through the core; and
first metallization features on a first side of the core and second metallization features on a second side of the core, wherein the first metallization features are embedded within a dielectric material on the first side of the core, and a sidewall of the dielectric material and of the first insulator layer defines a recess over an area of the metal layer.

2. The apparatus of claim 1, wherein a sidewall of the metal via is separated from the metal layer by a second dielectric material.

3. The apparatus of claim 2, wherein the metal via comprises a coaxial plated through-hole.

4. The apparatus of claim 1, further comprising:
a coaxial metal inductor loop through the core, wherein a sidewall of the coaxial metal inductor loop is separated from the metal layer by a magnetic material.

5. The apparatus of claim 4, wherein a sidewall of the metal via is separated from the metal layer by a second dielectric material, the metal via comprises a coaxial plated through-hole, and a height of the magnetic material along the sidewall of the coaxial metal inductor loop is different from a height of the second dielectric material along the sidewall of the coaxial plated through-hole.

6. The apparatus of claim 1, wherein a sidewall of the metal via is in direct contact with the metal layer.

7. The apparatus of claim 1, wherein the metal layer is exposed at a bottom of the recess.

8. The apparatus of claim 1, wherein the first and second insulator layers comprise a glass-reinforced epoxy resin, the dielectric material comprises an organic compound, the first metallization features comprise first interfaces to couple with an integrated circuit (IC) device through first-level interconnect features, and the second metallization features comprise second interfaces to couple with a host component through second-level interconnect features.

9. The apparatus of claim 1, further comprising:
a first integrated circuit (IC) chip within the recess; and
a second IC chip comprising first terminals coupled to first interfaces of the first metallization features, and second terminals coupled to first terminals of the first IC chip.

10. An apparatus, comprising:
a core comprising a laminate comprising a metal layer between a first insulator layer and a second insulator layer;
a metal via through the core; and
first metallization features on a first side of the core and second metallization features on a second side of the core, wherein the first metallization features are embedded within a dielectric material on the first side of the core and comprise first interfaces to couple with one or more integrated circuit (IC) devices through first-level interconnect features, the second metallization features comprise second interfaces to couple with a host component through second-level interconnect features, and a sidewall of the dielectric material and of the first insulator layer defines a recess over an area of the metal layer.

11. The apparatus of claim 10, wherein a sidewall of the metal via is separated from the metal layer by a second dielectric material.

12. The apparatus of claim 11, wherein the metal via comprises a coaxial plated through-hole.

13. The apparatus of claim 10, further comprising:
a coaxial metal inductor loop through the core, wherein a sidewall of the coaxial metal inductor loop is separated from the metal layer by a magnetic material.

14. The apparatus of claim 13, wherein a sidewall of the metal via is separated from the metal layer by a second dielectric material, the metal via comprises a coaxial plated through-hole, and a height of the magnetic material along the sidewall of the coaxial metal inductor loop is different from a height of the second dielectric material along the sidewall of the coaxial plated through-hole.

15. The apparatus of claim 10, wherein a sidewall of the metal via is in direct contact with the metal layer.

16. The apparatus of claim 10, wherein the metal layer is exposed at a bottom of the recess.

17. The apparatus of claim 10, wherein the first and second insulator layers comprise a glass-reinforced epoxy resin, and the dielectric material comprises an organic compound.

18. The apparatus of claim 10, further comprising:
a first integrated circuit (IC) chip within the recess; and
a second IC chip comprising first terminals coupled to first interfaces of the first metallization features, and second terminals coupled to first terminals of the first IC chip.

19. The apparatus of claim 10, further comprising:
a board;
a power supply; and
an integrated circuit package electrically attached to the board and the power supply, wherein the integrated circuit package comprises the core, the metal via, the first metallization features, the second metallization features, and an integrated circuit device with the recess.

20. The apparatus of claim 1, further comprising:
a board;
a power supply; and
an integrated circuit package electrically attached to the board and the power supply, wherein the integrated circuit package comprises the core, the metal via, the first metallization features, the second metallization features, and an integrated circuit device with the recess.

* * * * *